United States Patent [19]

Auzel et al.

[11] Patent Number: 4,627,064
[45] Date of Patent: Dec. 2, 1986

[54] MIXED OXIDES FOR TUNABLE LASERS

[75] Inventors: Francois Auzel, Le Mesnil St. Denis; Richard Moncorge, Trévoux; Denise Morin, Nogent sur Marne, all of France

[73] Assignee: L'Etat Francais representé par le Ministre des P.T.T. (C.N.E.T.), France

[21] Appl. No.: 673,439

[22] Filed: Nov. 20, 1984

[30] Foreign Application Priority Data

Nov. 22, 1983 [FR] France ................................. 83 18575

[51] Int. Cl.$^4$ ............................................. H01S 3/16
[52] U.S. Cl. ...................................... 372/41; 372/20; 252/301.17
[58] Field of Search ....................... 372/39, 41, 68, 20; 252/301.17

[56] References Cited

FOREIGN PATENT DOCUMENTS 1544279 8/1974 Fed. Rep. of Germany .
1360038 5/1963 France .
1494447 9/1966 France .

OTHER PUBLICATIONS

Moulton, "Pulse-Pumped Operation of Divalent Transition-Metal Lasers; IEEE J. QE., vol. QE 18, No. 8, pp. 1185-1188, Aug. 1982.
Chemical Abstracts, vol. 81, No. 22, Dec. 2, 1974, resume No. 142370s, Columbus, Ohio (US), & J. Solid State Chem., 1974, 11(2), 135-147, P. Porta et al.; "Distribution of Nickel Ions Among Octahedral and Tetrahedral Sites in Nickel Amuminum Oxide-Magnesium Aluminium Oxide-Magnesium Aluminum Oxide (NiAl2O4-MgAl2O4) Solid Solutions".

Primary Examiner—Leon Scott, Jr.

[57] ABSTRACT

The invention relates to a novel oxide for tunable lasers. These oxides comply with the formula:

$$(A_{1-x}X_x)_n(B_{1-y}Y_y)_mO_4$$

in which
A represents one or more elements chosen from the group Mg, Mn and Zn;
X represents one or more optically active divalent cations chosen from among V, Ni and Co;
B represents one or more elements of the same valence chosen in the group comprising Si, Ge, P, Te, W, Al, In, Ga and Mo;
Y represents one or more optically active trivalent cations chosen from among Cr, V and Ni;
x is such that $0 \leq x \leq 0.15$;
y is such that $0 \leq y \leq 0.15$; and
m and n are integers such that $2n + vm = 8$ with v representing the valence of B, provided that $y = 0$ when B represents one or more elements chosen from among Si, Ge, P, Te, W and Mo and x and y are not both equal to 0.

As an example of such oxides, reference is made to $Mg_{0.99}Ni_{0.01}Al_2O_4$ whose absorption spectrum (continuous lines) and emission spectrum (broken lines) are given in the attached drawing.

15 Claims, 4 Drawing Figures

MIXED OXIDES FOR TUNABLE LASERS

BACKGROUND OF THE INVENTION

The present invention relates to novel mixed oxides for tunable lasers. More specifically it relates to mixed oxides having a crystal field such that the tunable emission covers the wavelength range from to 1.8 μm.

In order to obtain tunable solid lasers it is known to use ions of transition metals such as $Cr^{3+}$, $V^{2+}$, $Ni^{2+}$ and $Co^{2+}$ as doping ions in oxides such as MgO and $BeAl_2O_4$ and fluorides such as $MgF_2$, $ZnF_2$ and $KZ_nF_3$. Thus, the article "Tunable alexandrite lasers", by Walling et al. in IEEE. J. Quantum Electron, vol. QE-16, no. 12, pp. 1302-1314, 1980 illustrates solid lasers tunable in the range 0.7 to 0.82 μm obtained by doping $BeAl_2O_4$ by $Cr^{3+}$. The article entitled "Broadly tunable cw operation of Ni: $MgF_2$ and Co: $MgF_2$ lasers" by P. F. Moulton et al. in Appl. Phys. Letter, vol. 35, 11, p. 838-840, 1979, shows that it is possible to obtain lasers tunable in the ranges 1.61 to 1.74 μm and 1.63 to 2.08 μm by doping $MgF_2$ respectively by Ni and Co.

Lasers tunable in the range 1.85 to 1.05 μm are also known, which are formed from $KZnF_3$ doped by $Co^{2+}$, as described in "CW IR laser action of optically pumped $Co^{2+}$: $KZnF_3$" by W. Kunzel et al., Optics Communications, vol. 36, no. 5, pp. 383-386 (1981).

Thus, none of the materials referred to hereinbefore makes it possible to cover the wavelength range between 1.1 and 1.6 μm which is of interest, e.g. for the spectroscopic study of semiconductor quaternary alloys of the InGaAsP type. Other materials suitable for this application are known and these are $MgF_2$: $V^{2+}$ and MgO: $Ni^{2+}$ which respectively cover the range 1.05-1.3 μm and 1.3 to 1.4 μm (cf. Appl. Phys. Lett. 35, p. 838, 1979).

However, the use of such materials suffers from certain difficulties. Thus, if it is wished to use $MgF_2$: $V^{2+}$, it is difficult to stabilize vanadium in valence 2 and any residual ion in another valence state acts as a poison, which reduces the emission yield.

Moreover, the $V^{2+}$ in $MgF_2$ has a diagram of energy levels such that the laser emission is reabsorbed as from the excited level emitting the laser effect. In addition, products containing $V^{2+}$ in fluoric matrixes are difficult to use.

In the case of MgO: $Ni^{2+}$, the main difficulty is in the production of said product in the form of monocrystals, because its melting point is very high, at approximately 3000° C. It is also difficult to obtain monocrystals of sufficient size and good optical quality for conventional pulling procedures, e.g. using the Czolchralski method.

SUMMARY OF THE INVENTION

The present invention relates to tunable solid lasers using novel mixed oxides for covering the wavelength range from 1 to 1.8 μm, said oxides also having the advantage of melting points which are at the most equal to 2000° C.

The tunable laser according to the invention comprises a monocrystal of a mixed oxide in accordance with the formula:

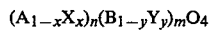

in which:

A represents one or more elements chosen from the group Mg, Mn and Zn;

X represents one or more optically active divalent cations chosen from among V, Ni and Co;

B represents one or more elemtns of the same valence chosen in the group comprising Si, Ge, P, Te, W, Al, In, Ga and Mo;

Y represents one or more optically active trivalent cations chosen from among Cr, V and Ni;

x is such that $0 \leq x \leq 0.15$;

y is such that $0 \leq y \leq 0.15$; and m and n are integers such that $2n + vm = 8$ with v representing the valence of B, provided that y=0 when B represents one or more elements chosen from among Si, Ge, P, Te, W and Mo and x and y are not both equal to 0.

According to a first embodiment of the invention, the element B represents one or more trivalent elements chosen from among Al, In and Ga, which can be partly substituted by optically active trivalent cations, Cr, V and Ni. In this case, the mixed oxide is in accordance with the formula:

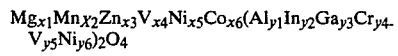

in which:

$x_1$, $x_2$, $x_3$ are numbers ranging from 0 to 1 provided that $0.85 \leq x_1 + x_2 + x_3 \leq 1$;

$x_4$, $x_5$ and $x_6$ are numbers ranging from 0 to 0.15, provided that $\leq 0 x_4 + x_5 + x_6 \leq 0.15$ and $x_1 + x_2 + x_3 + x_4 + x_5 + x_6 = 1$;

$y_1$, $y_2$ and $y_3$ are numbers ranging from 0 to 1, provided that $0.85 \leq y_1 + y_2 + y_3 \leq 1$; and $y_4$, $y_5$, $y_6$ are numbers ranging from 0 to 0.15, provided that $0 \leq y_4 + y_5 + y_6 \leq 0.15$, that $y_1 + y_2 + y_3 + y_4 + y_5 + y_6 = 1$, and that $x_4, x_5, x_6, y_4, y_5, y_6$ are not simultaneously equal to 0.

Examples of such oxides are: the oxides of formula:

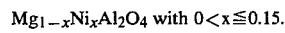

According to a second embodiment of the invention, element B of the general formula represents one or more tetravalent elements chosen from among Si, Ge, W, Mo and Te and in this case only the element A of the general formula is partly replaced by an optically active divalent cation. In this second embodiment of the invention, the mixed oxide is in accordance with the formula:

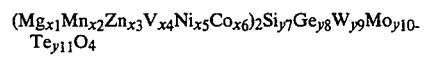

in which:

$x_1$, $x_2$ and $x_3$ are numbers ranging from 0 to 1, provided that $0.85 \leq x_1 + x_2 + x_3 < 1$;

$x_4$, $x_5$ and $x_6$ are numbers ranging from 0 to 0.15, provided that $0 < x_4 + x_5 = x_6 \leq 0.15$ and that $x_1 + x_2 + x_3 + x_4 + x_5 + x_6 = 1$; and $y_7, y_8, y_9, y_{10}$ and $y_{11}$ are numbers ranging from 0 to 1, provided that $y_7 + y_8 + y_9 + y_{10} + y_{11} = 1$.

Examples of such oxides are those of formula:

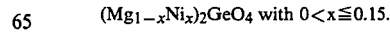

According to a third embodiment of the invention, element B is constituted by one or more hexavalent elements chosen from W and Mo. In this case, the mixed oxide is in accordance with formula:

$$Mg_{x_1}Mn_{x_2}Zn_{x_3}V_{x_4}Ni_{x_5}Co_{x_6}W_{y_{12}}Mo_{y_{13}}O_4$$

in which:

$x_1$, $x_2$, $x_3$ are numbers ranging from 0 to 1 with $0.85 \leq x_1 + x_2 + x_3 < 1$;

$x_4$, $x_5$ and $x_6$ are numbers ranging from 0 to 0.15, provided that $0 < x_4 + x_5 + x_6 \leq 0.15$ and that $x_1 + x_2 + x_3 + x_4 + x_5 + x_6 = 1$; and $y_{12}$ and $y_{13}$ are numbers ranging from 0 to 1 with $y_{12} + y_{13} = 1$.

Examples of such oxides are those of formula:

$$Zn_{1-x}Ni_xWO_4 \text{ with } 0 < x \leq 0.15.$$

According to a feature of the invention, the mixed oxides in accordance with the aforementioned formulas have a crystal field measured according to the method of Tanabe and Sugano such that (Dg)/B is at the most equal to 1.5. Information on the Tanabe and Sugano method is provided in particular in "Solid State Physics", vol. 9, F. Seitz and D. Turnbull-Ac-Press, p. 399, 1959.

The invention also relates to mixed oxides according to a formula:

$$(A_{1-x}X_x)_n(B_{1-y}Y_y)_mO_4$$

in which:

A represents one or more elements chosen from the group Mg, Mn and Sn;

X represents one or more optically active divalent cations chosen from among V, Ni and Co;

B represents one or more elements of the same valence chosen in the group comprising Si, Ge, P, Te, W, Al, In, Ga and Mo;

Y represents one or more optically active trivalent cations chosen from among Cr, V and Ni;

x is such that $0 \leq x \leq 0.15$;

y is such that $0 \leq y \leq 0.15$; and m and n are integers such that $2n + vm = 8$ with v representing the valence of B, provided that $y = 0$ when B represents one or more elements chosen from among Si, Ge, P, Te, W and Mo, x and y are not both equal to 0 and x does not represent Ni when $y = 0$ and A represents Mg.

The mixed oxides according to the invention can be prepared by conventional processes, e.g. by intimately mixing the desired quantitites of oxide powders or salts of A, X, B and Y and by then calcining the mixture obtained.

It is also possible to obtain the mixed oxides by coprecipitating hydroxides of A, X, B and Y from a solution of their salts in a solvent and then calcining the coprecipitate obtained.

When the mixed oxide is prepared from a mixture of oxide powders, the intimate mixing of the powders can take place in the solid state in a mortar by grinding for approximately 30 minutes. The powders can then be dispersed in an organic solvent such as ether or acetone, so as to improve the homogeneity of the mixture, followed by vigorous stirring of the suspension for approximately 30 minutes. The solvent, which has no chemical function, is then eliminated by evaporation.

For their use in tunable lasers, the mixed oxides according to the invention are then converted into monocrystals by conventional methods, e.g. by zone melting, pulling from a molten bath according to the Czochralski method or by the Verneuil method.

BRIEF DESCRIPTION OF THE DRAWINGS

The invention is described in greater detail hereinafter relative to the following Examples and with reference to the attached drawings, wherein show.

INVENTIVE EXAMPLES

Example 1

Preparation of $Mg_{0.99}Ni_{0.01}Al_2O_4$

We start with powders:

of magnesium carbonate $MgCO_3$ of analytical quality and marketed by Prolabo, of crystalline nickel nitrate $Ni(NO_3)_2, 6H_2O$ of analytical quality marketed by Prolabo, and calcined alumina $Al_2O_3$ marketed by Merck.

Quantities of these different powders are weighed which correspond to the preparation of mixed oxide of formula $Mg_{0.99}Ni_{0.01}Al_2O_4$, then they are ground and intimately mixed in an alumina mortar. The mixture is then introduced into a platinum crucible and heated in a muffle furnace at 800° C. for one hour in order to decompose the nitrate. The powder mixture is then ground again, heated to 1500° to 1600° C. and kept at this temperature for 17 hours in a rhodium furnace. A monocrystal is obtained from this mixed oxide by the Verneuil method.

The physical properties are determined (melting point, crystallographic structure, force of the crystal field Dq/B and refractive index). The optical properties (fluorescence-laser effect) of the crystal obtained in this way are also determined. The results are given in the attached table.

Figure 1:
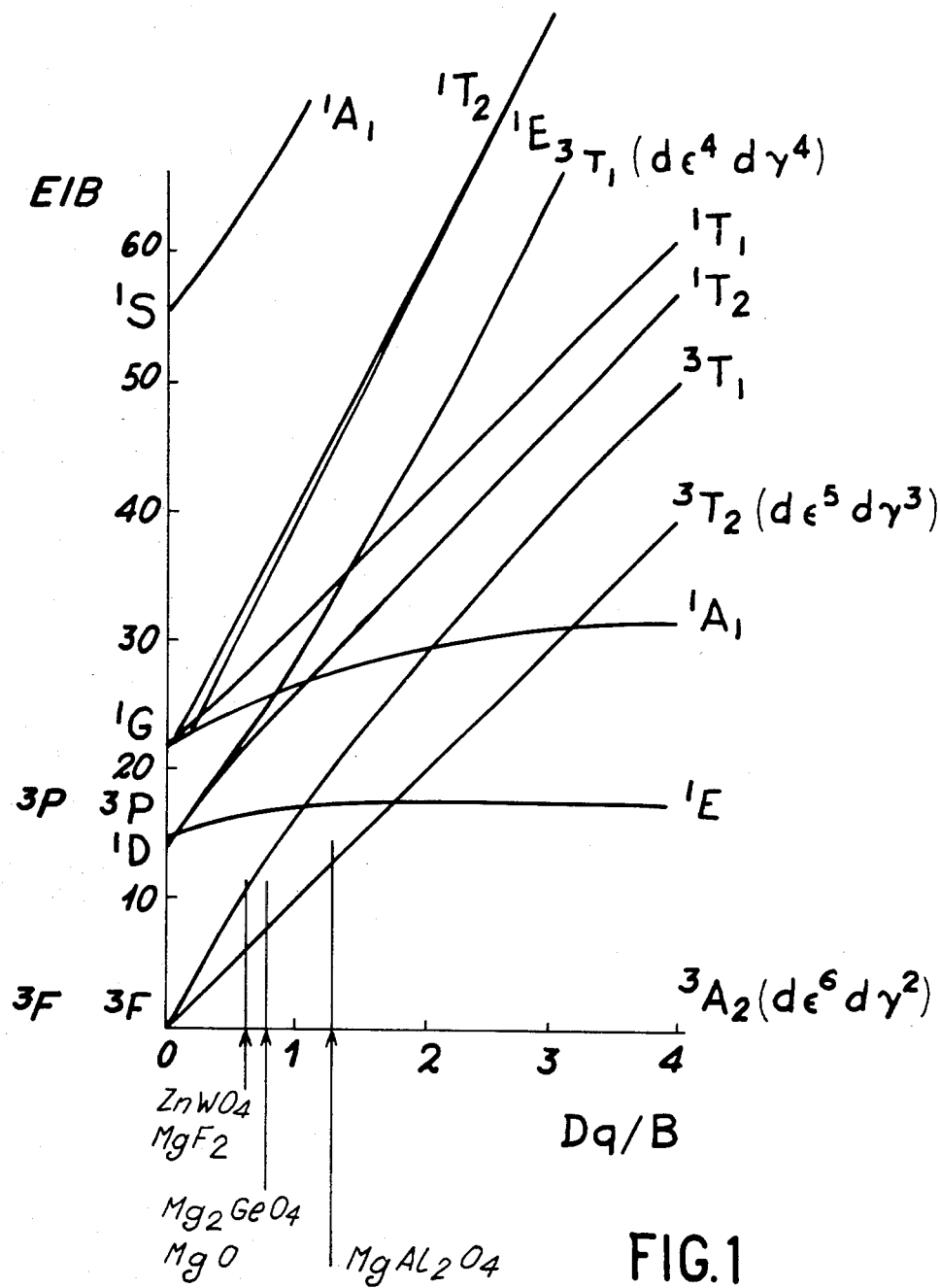
FIG. 1 the theoretical Tanabe and Sugano graph for $Ni^{2+}$.

It can be seen from these results that the force of the crystalline field Dq/B is equal to 1.32 and is slightly greater than that obtained with MgO, for which Dq/B is equal to 0.85. Moreover, when referring to the theoretical Tanabe and Sugano graph shown in FIG. 1 for $Ni^{2+}$, it can be seen that the energy gap of levels $^3T_2$ and $^3A_2$ is slightly higher than that obtained with MgO. Thus, a laser effect is obtained on the vibronic transitions at a wavelength slightly below that of MgO.

Figure 2:
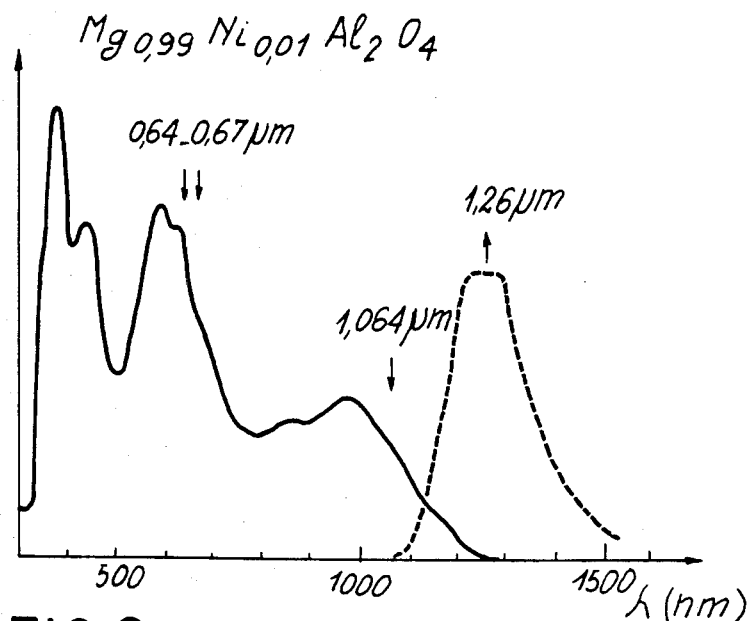
FIG. 2, absorption and emission spectra of 3 and 4 mixed oxides according to the invention.

FIG. 2 shows the absorption spectrum (in continuous line form) and the emission spectrum (in broken line form) of this compound. It can be seen that the absorption spectrum permits an excitation by commercial krypton lasers having a wavelength of 640 to 670 nm and aluminium and yttrium garnet lasers of formula $Y_3al_5O_{12}$ substituted by neodymium, i.e. YAG:Nd lasers having a wavelength of 1.06 μm. The emission spectrum shows that the emission corresponds to a tuning range of 1.1 to 1.5 μm.

Example 2

Preparation of $Mg_{1.98}Ni_{0.02}GeO_4$

We start with powders:

of germanium oxide $GeO_2$ of electronic quality produced by Preussag, of magnesium carbonate $MgCO_3$ of analytical quality marketed by Prolabo, and crystalline nickel nitrate Ni(NO$_3$)$_2$,6H$_2$O of analytical quality marketed by Prolabo.

The desired quantities of these different powders are mixed to obtain Mg$_{1.98}$Ni$_{0.02}$GeO$_4$ and they are intimately ground in an alumina mortar. The mixture is then introduced into a platinum crucible and heated in a muffle furnace at 800° C. for 1 hour in order to decompose the nickel nitrate. The mixture is again ground and then heated to 1000° C. for 1 hour in order to decompose the carbonate. This is followed by regrinding and heating the mixture in a rhodium furnace to 1300° C. It is then kept at this temperature for approximately 17 hours, in such a way that the reaction in the solid state is complete.

The thus obtained mixed oxide is converted into a monocrystal by the Czolchralski method.

This is once again followed by the measurement of the melting point, the crystallographic structure, the force of the crystal field Dq/B, the refractive index and the optical properties (fluoroscence and laser effect) of this mixed oxide. The results obtained are given in the attached table. It can be seen from the results that the crystal field Dq/B is equal to 0.82 and that it is slightly below that of MgO (0.85).

Figure 3:
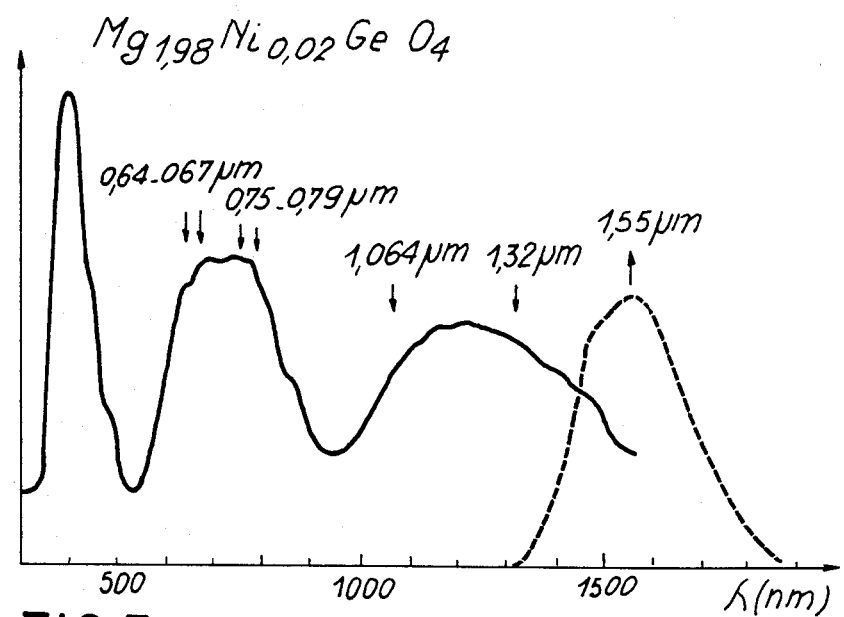

FIG. 3 shows the absorption spectrum (continuous lines) and the emission spectrum (broken lines) of this compound. Thus, it can be seen that the emission can be obtained in the wavelength range between 1.35 and 1.8 μm and that the excitation of this material can be carried out by known krypton lasers in the wavelength range 0.64 to 0.67 μm and 0.75 to 0.79 μm, or by a YAG :Nd laser at 1.06 or 1.32 μm.

Example 3

Preparation of Zn$_{0.99}$Ni$_{0.01}$WO$_4$

Powders of the following compounds are used:
chemically pure tungstic anhydride produced by Riedel,
zinc oxide of analytical quality marketed by Prolabo, and
crystalline nickel nitrate Ni(NO$_3$)$_2$,6H$_2$O of analytical quality marketed by Prolabo.

The desired quantities of the powders are weighed and mixed and intimately ground in an alumina mortar. The mixture is then introduced into a platinum crucible and is heated in a muffle furnace at 800° C. for 1 hour, in order to decompose the nickel nitrate. This is followed by regrinding. The mixture is then heated to 1300° C. and is kept at this temperature in a rhodium furnace for 17 hours. The product obtained is then converted into a monocrystal by the Czolchralski method.

As hereinbefore, the melting point, crystallographic structure, refractive index, and optical properties (fluorescence and laser effect) of said oxide are determined. The results are given in the attached table.

It can be seen from these results that the crystal field of the compound Dq/B is 0.7 and that it is relatively weak and relatively equivalent to that of MgF$_2$. Therefore the tuning range is identical to that of MgF$_2$:Ni, 1.6 to 1.75 μm.

Figure 4:
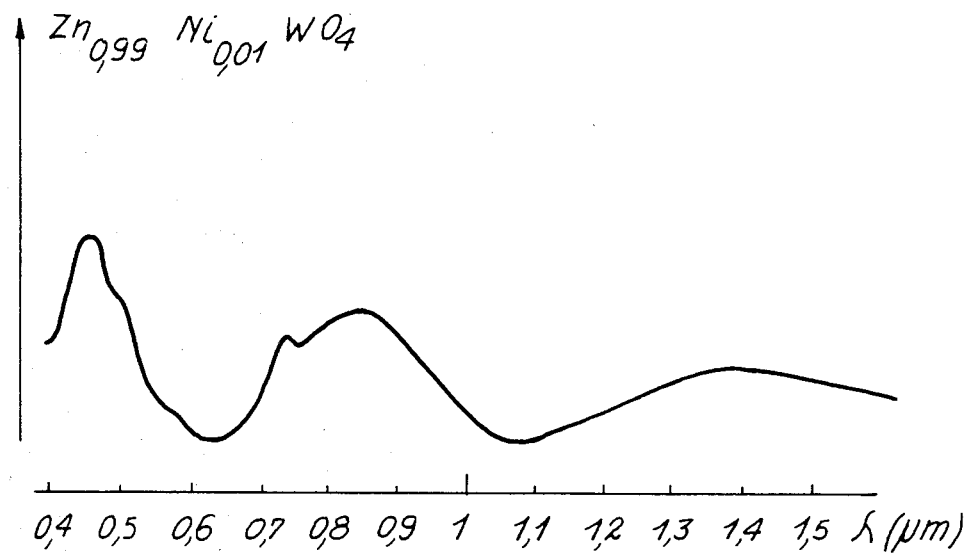

FIG. 4 shows the absorption spectrum of the compound.

TABLE

| | EXAMPLE 1<br>Mg$_{0.99}$Ni$_{0.01}$Al$_2$O$_4$ | EXAMPLE 2<br>Mg$_{1.98}$Ni$_{0.02}$GeO$_4$ | EXAMPLE 3<br>Zn$_{0.99}$Ni$_{0.01}$WO$_4$ |
|---|---|---|---|
| Melting point | 2000° C. | 1850° C. | 1360° C. |
| Crystallographic structure | Spinel (B site) | Orthorhombic | Monoclinic |
| Refractive index | 1.72 | 1.71 | ≃1.8 |
| Pumping laser | Krypton 0.64–0.67 μm<br>YAG (Nd$^{3+}$) 1.06 μm | Krypton 0.64–0.67 μm<br>0.75–0.79 μm<br>YAG (Nd$^{3+}$) 1.06 μm;<br>1.32 μm | Krypton 0.75–0.79 μm<br>YAG (Nd$^{3+}$) 1.32 μm |
| Force of crystal field Dq/B | 1.32 | 0.82 | 0.67 |
| Infrared emission range $^3T_2 \rightarrow {}^3A_2$ | 1.1–1.5 μm | 1.35–1.8 μm | ≃1.6–1.75 μm |
| Fluorescence lifetime τf | 1.35 ms | 420 μs | — |
| Quantum efficiency y = τf/τ$_o$ | ≃1 | ≃1 | — |
| Mid-height bank width δν | 1260 cm$^{-1}$ | 1100 cm$^{-1}$ | ≃1050 cm$^{-1}$ |
| Effective laser section σ$_l$ | 7.1 × 10$^{-21}$ cm$^2$ | 2.4 × 10$^{-20}$ cm$^2$ | — |

What is claimed is:

1. A tunable laser, including a monocrystal of a mixed oxide in accordance with the formula:

$$(A_{1-x}X_x)_n(B_{1-y}Y_y)_mO_4$$

in which:

A represents one or more elements chosen from the group Mg, Mn and Zn;

X represents one or more optically active divalent cations chosen from among V, Ni and Co;

B represents one or more elements of the same valence chosen in the group comprising Si, Ge, P, Te, W, Al, In, Ga and Mo;

Y represents one or more optically active trivalent cations chosen from among Cr, V and Ni;

x is such that 0 ≦ x ≦ 0.15;

y is such that 0 ≦ y ≦ 0.15; and m and n are integers such that $2n + vm = 8$ with v representing the valence of B, provided that y=0 when B represents one or more elements chosen from among Si, Ge, P, Te, W and Mo and x and y are not both equal to 0.

2. A tunable laser according to claim 1, wherein the mixed oxide is in accordance with the formula:

Mg$_{x1}$Mn$_{x2}$Zn$_{x3}$V$_{x4}$Ni$_{x5}$Co$_{x6}$(Al$_{y1}$In$_{y2}$Ga$_{y3}$Cr$_{y4-}$V$_{y5}$Ni$_{y6}$)$_2$O$_4$ in which:

$x_1$, $x_2$, $x_3$ are numbers ranging from 0 to 1 provided that $0.85 \leq x_1+x_2+x_3 \leq 1$;

$x_4$, $x_5$, $x_6$ are numbers ranging from 0 to 0.15, provided that $0 \leq x_4+x_5+x_6 \leq 0.15$ and $x_1+x_2+x_3+x_4+x_5+x_6=1$;

$y_1$, $y_2$ and $y_3$ are numbers ranging from 0 to 1, provided that $0.85 \leq y_1+y_2+y_3 \leq 1$; and $y_4$, $y_5$, $y_6$ are numbers ranging from 0 to 0.15, provided that $0 \leq y_4+y_5+y_6 \leq 0.15$, that $y_1+y_2+y_3+y_4+y_5+y_6=1$ and that $x_4$, $x_5$, $x_6$, $y_4$, $y_5$, $y_6$ are not simultaneously equal to 0.

3. A tunable laser according to claim 1, wherein the mixed oxide is in accordance with the formula:

$$(Mg_{x_1}Mn_{x_2}Zn_{x_3}V_{x_4}Ni_{x_5}Co_{x_6})_2Si_{y_7}Ge_{y_8}W_{y_9}Mo_{y_{10}}Te_{y_{11}}O_4$$

in which:

$X_1$, $x_2$ and $x_3$ are numbers ranging from 0 to 1 provided that $0.85 \leq x_1+x_2+x_3 < 1$ $x_4$, $x_5$, $x_6$ are numbers ranging from 0 to 0.15, provided that $0 < x_4+x_5+x_6 \leq 0.15$ and that $x_1+x_2+x_3+x_4+x_5+x_6=1$; and $y_7$, $y_8$, $y_9$, $y_{10}$, and $y_{11}$ are numbers ranging from 0 to 1, provided that $y_7+y_8+y_9+y_{10}+y_{11}=1$.

4. A tunable laser according to claim 1, wherein the mixed oxide is in accordance with formula:

$$Mg_{x_1}Mn_{x_2}Zn_{x_3}V_{x_4}Ni_{x_5}Co_{x_6}W_{y_{12}}Mo_{y_{13}}O_4$$

in which:

$x_1$, $x_2$, $x_3$ are numbers ranging from 0 to 1 with $0.85 \leq x_1+x_2+x_3+ < 1$;

$x_4$, $x_5$, $x_6$ are numbers ranging from 0 to 0.15, provided that $0 < x_4+x_5+x_6 \leq 0.15$ and that $x_1+x_2+x_3+x_4+x_5+x_6=1$; and $y_{12}$ and $y_{13}$ are numbers ranging from 0 to 1 with $y_{12}+y_{13}=1$.

5. A tunable laser according to claim 1, wherein the mixed oxide is an accordance with formula $Mg_{1-x}Ni_x\cdot Al_2O_4$ in which x is a number such that $0 < x \leq 0.15$.

6. A tunable laser according to claim 1, wherein the mixed oxide is in accordance with the formula $(Mg_{1-x}Ni_x)_2GeO_4$ in which x is a number such that $0 < x \leq 0.15$.

7. A tunable laser according to claim 1, wherein the mixed oxide is in accordance with the formula: $Zn_{1-x}Ni_xWO_4$ in which x is a number such that $0 < x \leq 0.15$.

8. A tunable laser according to any one of the claims 1 to 4, wherein the mixed oxide has a crystal field force measured according to the Tanabe and Sugano method such that said force $\leq 1.8$.

9. A mixed oxide, wherein said oxide comprises the formula:

$$(Al_{1-x}X_x)_n(B_{1-y}Y_y)_mO_4$$

in which:

A represents one or more elements chosen from the group Mg, Mn and Sn;

X represents one or more optically active divalent cations chosen from among V, Ni and Co B represents one or more elements of the same valence chosen in the group comprising Si, Ge, P, Te, W, Al, In, Ga and Mo;

Y represents one or more optically active trivalent cations chosen from among Cr, V and Ni;

x is such that $0 \leq x \leq 0.15$;

y is such that $0 \leq y \leq 0.15$; and m and n are integers such that $2n+vm=8$ with v representing the valence of B, provided that $y=0$ when B represents one or more elements chosen from among Si, Ge, P, Te W and Mo, x and y are not both equal to 0 and x does not represent Ni when $y=0$ and A represents Mg.

10. A mixed oxide according to claim 9, wherein said oxide complies with the formula:

$$Mg_{x_1}Mn_{x_2}Zn_{x_3}V_{x_4}Ni_{x_5}Co_{x_6}(Al_{y_1}In_{y_2}Ga_{y_3}Cr_{y_4}V_{y_5}Ni_{y_6})_2O_4$$

in which:

$x_1$, $x_2$, $x_3$ are numbers ranging from 0 to 1 provided that $0.85 \leq x_1+x_2+x_3 \leq 1$;

$x_4$, $x_5$, $x_6$ are numbers ranging from 0 to 0.15, provided that $0 \leq x_4+x_5+x_6 \leq 0.15$ and $x_1+x_2+x_3+x_4+x_5+x_6=1$;

$y_1$, $y_2$ and $y_3$ are numbers ranging from 0 to 1 provided that $0.85 \leq y_1+y_2+y_3 \leq 1$; and $y_4$, $y_5$, $y_6$ are numbers ranging from 0 to 0.15, provided that $0 \leq y_4+y_5+y_6 \leq 0.15$, that $y_1 30\ y_2+y_3+y_4+y_5+y_6=1$ and that $x_4$, $x_5$, $x_6$, $y_4$, $y_5$, $y_6$ are not simultaneously equal to 0, and that $x_5=0$ when $y_2$, $y_3$, $y_4$, $y_5$, $y_6$ are all equal to 0.

11. A mixed oxide according to claim 9, wherein said oxide complies with the formula:

$$(Mg_{x_1}Mn_{x_2}Zn_{x_3}V_{x_4}Ni_{x_5}Co_{x_6})_2Si_{y_7}Ge_{y_8}W_{y_9}Mo_{y_{10}}Te_{y_{11}}O_4$$

in which:

$x_1$, $x_2$, $x_3$ are numbers ranging from 0 to 1 provided that $0.85 \leq x_1+x_2+x_3 < 1$; $x_4$, $x_5$, $x_6$ are numbers ranging from 0 to 0.15, provided that $0 < x_4+x_5+x_6 \leq 0.15$ and that $x_1+x_2+x_3+x_4+x_5+x_6=1$; and $y_7$, $y_8$, $y_9$, $y_{10}$, $y_{11}$ are numbers ranging from 0 to 1, provided that $y_7+y_8+y_9+y_{10}+y_{11}=1$.

12. A mixed oxide according to claim 9, wherein said oxide is in accordance with the formula:

$$Mg_{x_1}Mn_{x_2}Zn_{x_3}V_{x_4}Ni_{x_5}Co_{x_6}W_{y_{12}}Mo_{y_{13}}O_4$$

in which:

$x_1$, $x_2$, $x_3$ are numbers ranging from 0 to 1 with $0.85 \leq x_1+x_2+x_3 < 1$;

$x_4$, $x_5$, $x_6$ are numbers ranging from 0 to 0.15, provided that $0 < x_4+x_5+x_6 \leq 0.15$ and that $x_1+x_2+x_3+x_4+x_5+x_6=1$, and $y_{12}$ and $y_{13}$ are numbers ranging from 0 to 1 with $y_{12}+y_{13}=1$.

13. A mixed oxide according to claim 9, wherein said oxide complies with the formula $(Mg_{1-x}Ni_x)_2GeO_4$ in which x is a number such that $0 < x \leq 0.15$.

14. A mixed oxide according to claim 9, wherein said oxide complies with the formula $Zn_{1-x}Ni_xWO_4$ in which x is a number such that $0 < x \leq 0.15$.

15. A mixed oxide according to claim 9, wherein said oxide has a crystal field force measured in accordance with the Tanabe and Sugano method such that said force $=1.8$.

* * * * *